(12) United States Patent
Liu et al.

(10) Patent No.: US 6,248,629 B1
(45) Date of Patent: Jun. 19, 2001

(54) PROCESS FOR FABRICATING A FLASH MEMORY DEVICE

(75) Inventors: Yow-Juang William Liu, San Jose; Gu Fung David Tsuei, Sunnyvale; Jian Chen, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/040,823

(22) Filed: Mar. 18, 1998

(51) Int. Cl.[7] ............................................. H01L 21/8247
(52) U.S. Cl. ............................................ 438/258; 438/279
(58) Field of Search .............................. 438/257–267, 438/279

(56) References Cited

U.S. PATENT DOCUMENTS

| | | |
|---|---|---|
| 4,698,787 | 10/1987 | Mukherjee et al. . |
| 5,103,274 | 4/1992 | Tang et al. . |
| 5,183,773 * | 2/1993 | Miyata . |
| 5,538,912 * | 7/1996 | Kunori et al. . |
| 5,789,294 * | 8/1998 | Choi ...................................... 438/258 |
| 5,933,730 * | 8/1999 | Sun et al. .............................. 438/258 |

OTHER PUBLICATIONS

Wolf et al., "Silicon Processing for the VLSI Era vol. 1; Process Technology", Lattice Press, pp. 292–294, 1986.*

Samachisa, et al., "*A 128K Flash EEPROM Using Double–Polysilicon Technology*," IEEE Journal of Solid–State Circuits, vol. SC–22, No. 5, Oct. 1987.

* cited by examiner

*Primary Examiner*—Richard Booth
(74) *Attorney, Agent, or Firm*—Fliesler Dubb Meyer & Lovejoy LLP

(57) ABSTRACT

A method for manufacturing a non-volatile memory device, the device having a core memory cell region and a periphery region, comprising the steps of: forming memory cell gate structures in the core memory cell region; forming active regions adjacent to the gate structure through a blanket implant; forming an implant/etch mask; implanting an impurity into one of the active regions; etching an oxide layer in the implant region; and forming active devices in the periphery region. In a further aspect, the method comprises method of performing a self aligned source etch in forming a memory device, comprising: forming resist spacers adjacent to the channel regions of the memory device; and etching the oxide layer.

25 Claims, 13 Drawing Sheets

Figure 1B

Periphery

Core

12

(PRIOR ART)
Figure 3
Core Region    Periphery Region
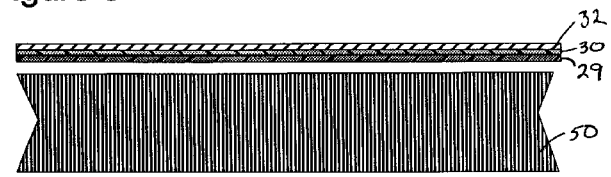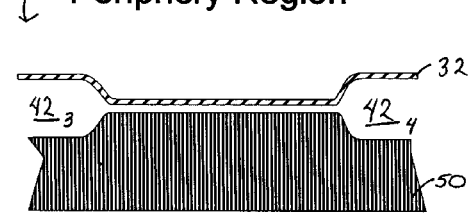
Figure 4
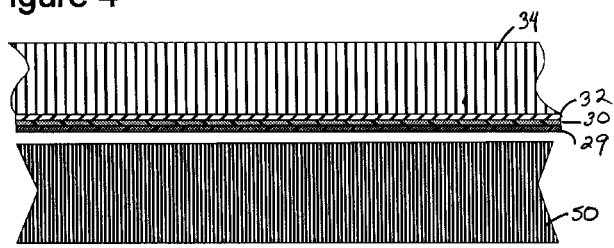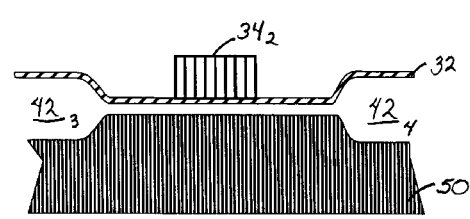
Figure 5
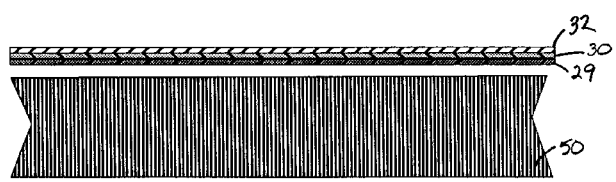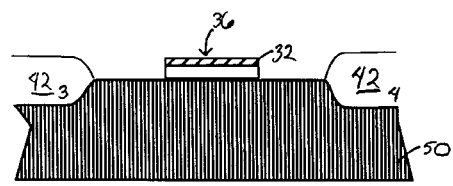
Figure 6
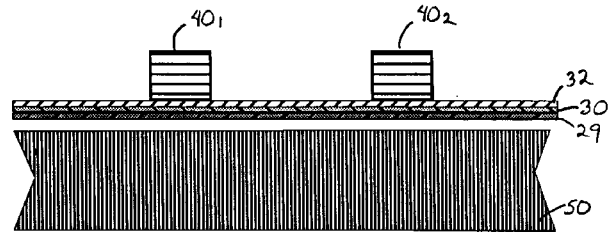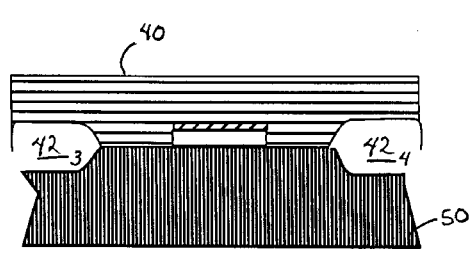

CORE PERIPHERY
Figure 7A
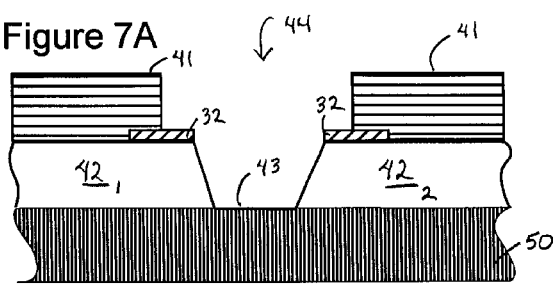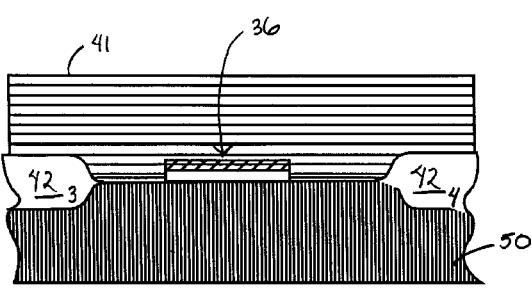
Figure 7B
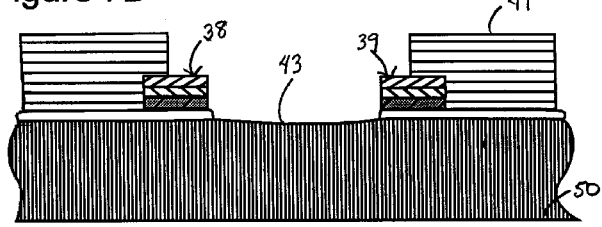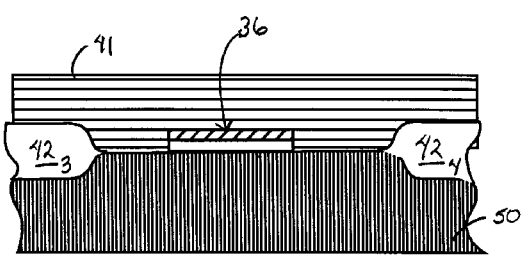
Figure 8
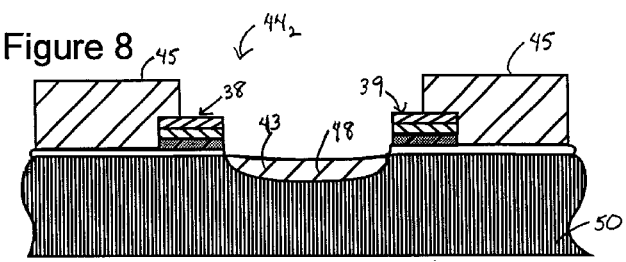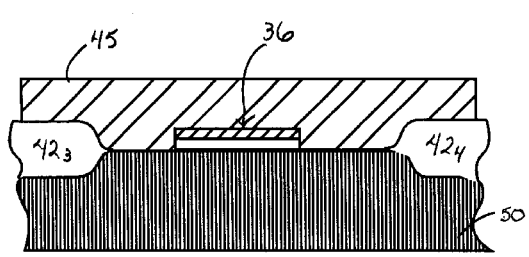
Figure 9
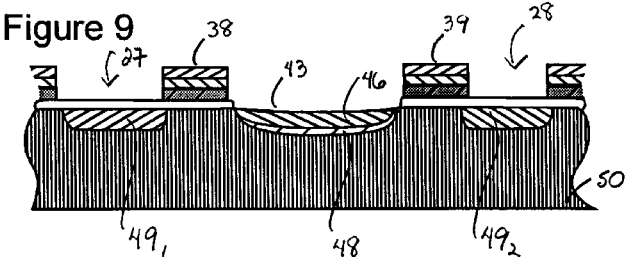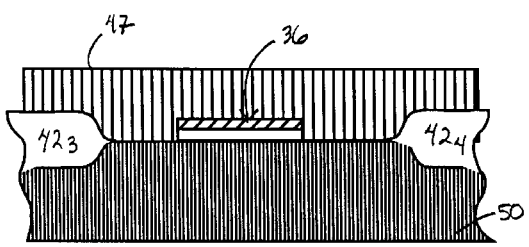

Figure 10 Core Periphery
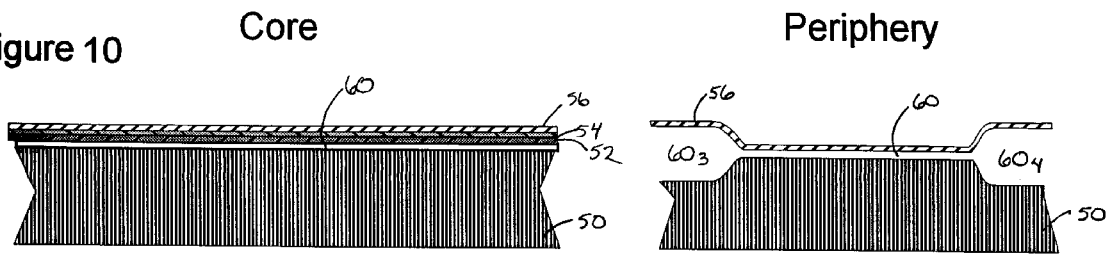
Figure 11
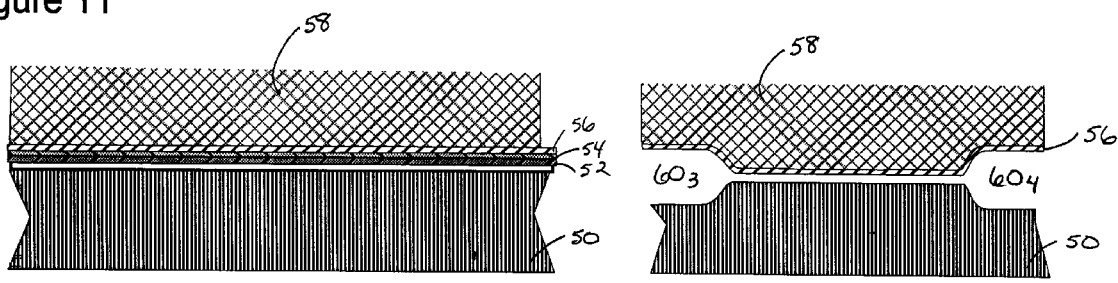
Figure 12
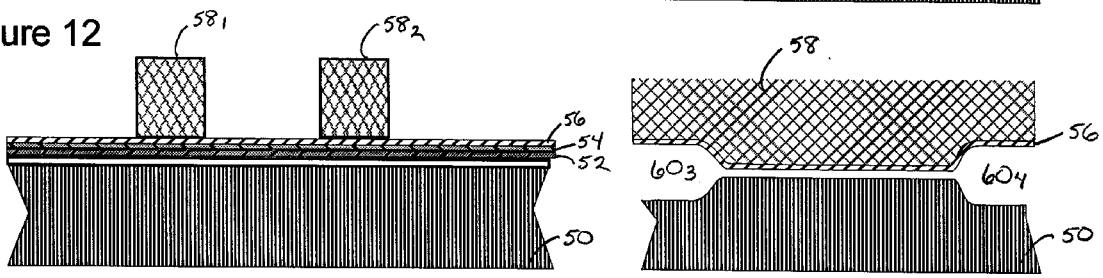
Figure 13
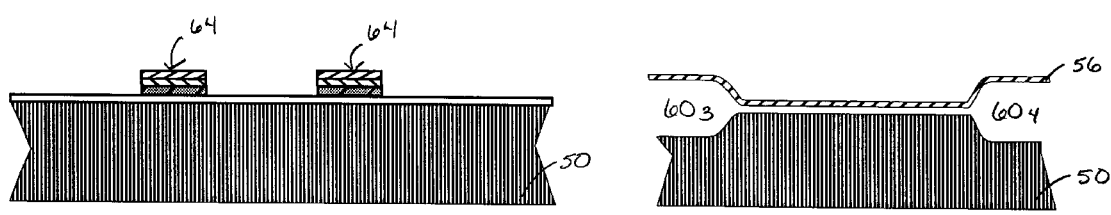
Figure 14
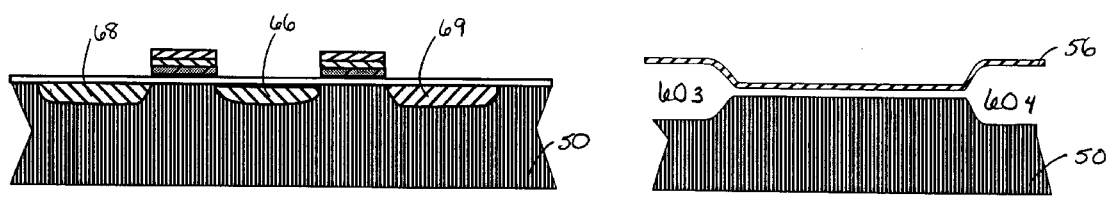

CORE

CORE

Core                               Periphery

US 6,248,629 B1

PROCESS FOR FABRICATING A FLASH MEMORY DEVICE

BACKGROUND OF THE INVENTION

1. Field of the Invention

This invention relates generally to semiconductor devices and process for fabricating the same and, particularly to a process for fabricating a flash EPROM or EEPROM memory device.

2. Description of the Related Art

Non-volatile memory devices, and particularly so-called "flash" memory devices, have become increasingly more popular in data storage applications. The term EPROM is an acronym for Erasable Programmable Read Only Memory, while EEPROM refers to Electrically Erasable PROMs. The term "flash" in conjunction with electrical erasable programmable read only memory or "flash EEPROMS", generally refers to EEPROM memory cells which are programmed by hot electron injection and erased by Fowler-Nordheim tunneling. The operation and structure of such devices is discussed in U.S. Pat. No. 4,698,787, issued Oct. 6, 1987, to Mukherjee et al., and IEEE Journal of Solid State Circuitry, Vol. SC-22, No. 5, October, 1987, pages 676–683 in an article entitled, "A 128K Flash EEPROM Using Double Polysilicon Technology" by Gheorghe Samachisa, et al.

Generally, an array of flash EPROM or EEPROM memory cells may be formed on a semiconductor substrate in a series of rows and columns, accessed by conductors referred to as word lines and bit lines. A portion of an array is illustrated schematically in FIG. 1A. In FIG. 1A, a two-by-two matrix of memory cells 100 is shown with a first memory cell 20 having its drain connected to bit line 0 (BL0), its control gate coupled to word line 0 (WL0) and its source floating. Also shown in FIG. 1A is a second memory cell 22 also having its drain connected to BL0, its control gate coupled to word line 1 (WL1) and its source floating. As illustrated in FIG. 1A, the sources of the memory cells 20, 22, 24 and 26 are shown to be floating; however, the sources can be connected to form a common source line.

To program a cell, such as cell 20, the hot injection mechanism is normally induced by grounding the source region, applying a relatively high positive voltage (approximately 12V) to the control gate and applying a moderate voltage (approximately 5V or $V_{cc}$) to the drain in order to generate high energy (hot) electrons. After sufficient negative charge accumulates onto the floating gate, the negative potential of the floating gate rises to a threshold voltage and inhibits current flow through the channel region during any subsequent read mode operation. Typically, in the read mode, a relatively low positive voltage, for example 1.5V, is applied to the drain, 5V or $V_{cc}$ is applied to the control gate and 0V is applied to the source of the memory cell. The magnitude of the read current is used in determining whether the flash EPROM or EEPROM cell is programmed or not.

Erasing flash EPROM or EEPROM cells is typically carried out by Fowler-Nordheim tunneling between the floating gate and the source (known as source erase or negative gate erase) or between the floating gate and the substrate (known as channel erase). The source erase operation is induced by applying a high positive voltage (approximately 12V) to the source region and 0V to both the control gate and the substrate, while floating the drain region of the memory cell. The negative gate erase operation is induced by applying 5V or $V_{cc}$ to the source region, and negative voltage (as much as −10V) to the control gate and 0V to the substrate, while floating the drain of the memory cell. The channel erase operation is induced by applying a high positive voltage (approximately 12V) to the substrate and 0V to the control gate, while floating both the source and drain of the memory cell.

As shown in FIG. 1B, in a memory device such as a flash EPROM or EEPROM, memory cells are arranged in a common region, with the memory cell region (a portion of which is shown in FIG. 1A) of the flash memory array being referred to as the "core" area of the chip. All other devices necessary for operation of the device, such as the select transistors and amplifiers, are located in the "periphery" area of the chip. In the core region, all memory cells have essentially the same dimensions, allowing simultaneous fabrication of the cells in the core region using common processing steps. Each memory cell is formed in the semiconductor substrate by, for example, diffusion of an n+ drain region, and an n type, double diffused source region, with a channel region positioned between the drain and source regions. The double diffused source region is formed of a deeply diffused, but lightly doped n type region, commonly doped with phosphorous (known as a double diffused junction (DDJ)), and a more heavily doped but more shallowly diffused n+ region, commonly doped with arsenic (As) within the DDJ. A tunnel oxide is formed on the silicon substrate separating a floating gate from the source and drain regions, and a control gate is formed over the floating gate, separated therefrom by an inter-polysilicon dielectric layer.

FIG. 2 illustrates a top view of a portion of a semiconductor substrate under fabrication as a flash cell, such as that shown schematically in FIG. 1A. Shown in FIG. 2 are two unit cells 20,22, formed by a second polysilicon gate layer or control gate layer 32 (defining wordline ø (WLø)) deposited on top of an interdielectric layer 30 (shown in FIG. 5) such as oxinitride, and a first polysilicon gate layer or floating gate layer 29. Field oxide regions 42 formed by, for example, a LOCOS process, separate and isolates adjacent memory devices. A common source region 43 is used for adjacent cells and is formed by a self-aligned source mask and etch, as discussed below.

One conventional method of manufacturing a flash EPROM or EEPROM array includes a number of separate masking steps between the point in time when polysilicon layers (or "poly stack") which will form control gate and floating gate regions are deposited onto a substrate, and the steps of formation of the core memory devices. (It should be recognized that complete processing of the integrated circuit requires a substantial number of processing steps which are not detailed here in order not to unduly obscure the nature of the present invention. Such processing steps would be within the knowledge and skill of one of average skill in the art.)

In general, in one exemplary prior art process, the periphery devices are formed early in the process sequence, with the core region covered by a mask layer to prevent processing occurring in the periphery area from affecting the core area. After the periphery devices are formed, the masking over the core area is removed and the core area cells are formed, followed by junction implantation processing in the periphery area. The conventional process for forming the periphery cells requires the use of several masks to protect the core memory area from damage during its formation.

One portion of a conventional process flow which may be used for forming a memory array is illustrated in FIGS. 3–8. In FIGS. 3–8, the left side of each figure represents cross-sections of the core area (10), while the right side of each figure represents cross-sections of process steps occurring in the periphery area (12). FIGS. 7A and 7B illustrate the effects of identical process steps on different cross-sections of the device, represented along line A—A and B—B, respectively, in FIG. 2.

FIG. 3 shows a wafer substrate 50 having formed on it lateral isolation by, for example, a local oxidation of silicon (LOCOS) process growing select portions of a pad oxide resulting in field oxide regions $42_1$–$42_2$ (FIG. 2) and $42_3$–$42_4$ (FIG. 3). After formation of the field oxide regions, conventional polysilicon layer deposition and masking techniques will result in the provision of a first polysilicon layer 29 and an inter-polysilicon dielectric layer 30, overlying core region 10 of the array. A second polysilicon layer 32 is simultaneously deposited in both core region 10 and periphery region 12 of substrate 50. It should be recognized that polysilicon layers 29 and 32 may also be comprised of a polysilicide.

Once the polysilicon layers 29,32 are formed, the gate structures for cells in periphery area 12 are etched and prepared for junction implantation prior to formation of gate structures in core area 10.

FIGS. 4 and 5 show processing in the periphery region while the core is masked. A periphery gate photoresist layer 34 will be deposited on the surface of polysilicon layer 32 to cover the entire substrate. Next, layer 34 will be patterned by exposing resist layer 34 to a mask and, depending on whether a positive or negative resist is used, removing exposed or unexposed portions of the resist in the periphery area 12 leaving portions $34_2$. As shown in FIG. 4, masking layer 34 remains unpatterned in the core area 10. A periphery gate structure 36 will then be etched in periphery area 12, using any number of conventional anisotropic dry etch processes. Next, the remaining portions $34_2$ of resist layer 34 are stripped, leaving the gate structure shown in FIG. 5.

After the periphery devices are formed, the core device processing begins. Once the periphery gate devices 36 are formed, a core cell mask layer 40 will be applied to cover periphery area 12 and core area 10. As shown in FIG. 6, the core cell mask 40 is then patterned by exposing the resist and removing portions of the resist in core area 10, leaving selected portions $40_1$,$40_2$. Core cell mask portions $40_1$,$40_2$ are utilized to etch core cell gate structures 38,39 (shown in FIG. 7B). Core resist 40 will be stripped. Each gate structure 38,39 comprises a portion of first polysilicon layer 29, dielectric layer 30, and second polysilicon layer 32.

Next, isolation oxide $42_1$ will be etched to allow formation of a self-aligned source region 43, common to cells 101,102. FIGS. 7A and 7B show cross-sections of wafer formation along lines A—A and B—B, respectively, in FIG. 2. FIGS. 7A and 7B are provided to illustrate the effect of a self-aligned source mask and source etch, utilized in the prior art process, on the underlying substrate 50. Referring to FIG. 2, to form self-aligned source region 43, a portion of the field oxide region $42_1$ must be removed to expose substrate 50 in area 43 so that implantation and diffusion of, for example, an n type impurity may take place in the source region 43. This is conventionally known as the self-aligned source or "SAS" etch.

Referring to FIG. 7A, a self-aligned source photoresist mask layer (SAS mask) 41 is deposited over the surface of field oxide regions $42_{1-4}$ in the periphery and core areas, and patterned by mask exposure and resist stripping to expose a region 44 between adjacent second polysilicon layers 32 as shown in FIG. 7B. Field oxide $42_1$–$42_{12}$ is then etched using, for example, a reactive ion etch process to expose the surface of silicon substrate 50. As shown in FIG. 7B, in the pad oxide area, the SAS etch will remove not only portions of oxide layer $42_1$,$42_2$ but also a small portion of substrate 50.

FIG. 7C depicts a cross-sectional side view of the gate stack 38 in a conventional flash cell and the damage done to the substrate 50 in the overlap area (shown to the left of line E) between the gate stack and the source area 43 caused by etching of source area 43 into the substrate 50. As seen in FIG. 7C, when the source area 43 is etched, layers of the substrate 50 are removed such that the source area no longer has a flat top surface but instead has a depressed top surface as shown by the dashed line D in FIG. 7C. After the etching of the source area 43, the damaged area of the substrate 50 is not limited to the top of the etched source area 43 but includes the area where the gate stack overlaps the source area 43. It is this area of damage present to the left of dashed line E that causes a variance in the $V_t$ characteristics of flash memory cells.

Generally, before memory cell 20 (FIG. 1A) can be programmed it must be erased along with all of the other memory cells within the matrix 100. Erasing of flash memory cells is typically performed by application of an erase voltage, as described above, to each of the memory cells over their respective control gates. After each application of an erase voltage, a verify voltage is applied to the memory cell to verify that the memory cell has actually been erased. If a particular memory cell does not conduct a current during the verify step, indicating that the memory cell is not fully erased, additional erasing voltages are applied until the memory cell conducts. Overerasing occurs because each application of the erase voltage removes electrons from the floating gate of the memory cells, including those cells that have been properly erased. When too many electrons have been removed, the floating gate becomes positively charged, thereby causing the overerase condition.

In order to read the contents of the memory cell 20 a voltage is applied to the drain of the programmed memory cell 20 and the contents of the cell are read onto BL0. At the same time, a small current I from erased memory cell 22 is also present on BL0. This small current, I, present on BL0 from memory cell 22 is what is known as column leakage and can promote serious errors in that the information present on BL0 will be incorrect. For example, in the situation described above, the information present on BL0 would be the information read from the programmed memory cell 20 and also include the leakage current I from memory cell 22. The column leakage current I, is a direct result of the variable $V_t$ characteristics between memory cell 20 and memory cell 22.

After the SAS etch is performed, resist layer 41 is stripped, leaving the structure shown in FIG. 8 prior to deposition of resist layer 45 for the double-diffusion implant.

In the conventional process, after the gate structures 38,39 are formed, impurities are provided into the substrate by implantation to form the source and drain regions. However, the SAS etch of the silicon on the surface of substrate 50 in region 44, as shown in FIGS. 7A and 7B, will result in the formation of polymers on the surface of substrate 50 which must be removed before any implantation or diffusion of impurities into substrate 50 can proceed. Thus, in the conventional process, a pre-implant oxidation step is required to cure and clean the surface of substrate 50 at area 43.

As shown in FIG. 8, after the pre-implant oxidation of substrate 50 and the oxide is stripped, a double diffusion implant photoresist mask 45 is formed over the surface of core area 10 and periphery area 12, patterned over core area 10 in region 442. An n type impurity such as phosphorous is implanted in the surface of substrate 50 using a low energy implant to form region 48 which serves as a portion of the common source. This is commonly referred to as the "DDI" (double diffusion implant). The low energy implant may be optionally followed by substrate heating to induce drive in of the impurities. The double diffusion implant mask 45 is then stripped.

Next, as shown in FIG. 9, a core n+ implant photoresist mask layer 47 is applied to the core area 10 and periphery area 12, and patterned using conventional photolithography techniques to expose areas of substrate 50 overlying source region 43 and drain regions 27,28 (FIG. 2). An n+ impurity implant is made into regions 27,28 and source region 43 to form n+ impurity region 46 and drain impurity regions $49_1, 49_2$ in substrate 50. After implantation of the n+ impurity regions $49_1, 49_2$ and 48, the core n+ implant mask 47 is stripped and processing on the core side 10 of the array is essentially completed. Processing of the integrated circuit to form other devices and structures necessary for the memory may proceed in accordance with well-known techniques.

For example, completion of the active devices in periphery region 12 will thereafter be performed. Generally, formation of the periphery transistors proceeds in accordance with well-known methods for forming lightly-doped drain transistors, which are summarized, (but not illustrated), by the following steps:

1. Performing a second pre-implant oxidation clean to remove n+ implant-formed polymers and removing the oxide. (A thicker oxide is grown in the core region to protect the core region during LDD implants);
2. Forming an n type, lightly doped drain (LDD) implant photoresist mask layer and patterning the mask layer (in periphery area 12);
3. Implanting an n type impurity to form n type, LDD regions and stripping the n type LDD resist;
4. Forming a p type, LDD implant photoresist mask layer and patterning the mask layer;
5. Implanting a p type impurity to form p type, LDD regions and stripping the p type LDD resist;
6. Forming inert spacers for the n+ and p+ regions by depositing a spacer material and etching the spacer material;
7. Performing a third pre-implant oxidation to clean substrate 50;
8. Forming n type source/drain implant photoresist mask layer and patterning the mask layer;
9. Implanting an n type impurity to form n+ source/drain regions, and stripping the photoresist;
10. Forming a p type source/drain photoresist mask and patterning the resist;
11. Implanting a p type impurity to form p+ source/drain regions, and stripping the resist; and,
12. Oxidizing and/or annealing the source/drain regions.

After completion of the periphery transistors, contacts are formed utilizing conductive layers of metals or refractive metal silicides to complete formation of the integrated circuit device.

Thus, in the prior art, nine separate masking steps are required: the periphery gate mask; the core cell mask; the self-aligned source mask; the double-diffused implant mask; the core n+ implant mask; the n type LDD implant mask; the p type LDD implant mask; the n+ type source drain implant mask, and the p+ type source drain implant mask.

SUMMARY OF THE INVENTION

The invention generally comprises a method for manufacturing a non-volatile memory device, the device having a core memory cell region and a periphery region, comprising the steps of: forming a core cell resist mask layer; forming memory cell gate structures in the core memory cell region; removing the core cell mask layer; forming a periphery region photoresist masking layer; and forming active devices in the periphery region.

In a more particular aspect, the method comprises: forming gate stacks in the core cell area; masking the periphery device area with a first mask; forming a plurality of first active regions and a plurality of second active regions about the gate stacks in the core cell area through a blanket implant of an impurity; masking the gate stacks and the plurality of first active regions with an implant/etch mask layer; forming a graded implant region by implanting an impurity in said plurality of second active regions; and etching the oxide overlying the plurality of second active regions.

In a further embodiment, a conformal resist coating is used to form spacers adjacent to the implant/etch mask. In one embodiment, the method includes the steps of depositing a conformal resist coating over the surface of the gate stack and the implant/etch mask layer following the implant forming the graded implant region; etching the conformal resist layer to form spacers adjacent to the gate stacks; and etching the oxide layer overlying the source region to enable connection to the implanted impurities.

In an alternative embodiment, the conformal resist layer is deposited prior to the graded junction implant, and the spacers formed after the implant.

In a still further embodiment, the conformal resist can be deposited on the gate stacks, and the spacers formed prior to the blanket implant, with the spacers remaining in place through the formation of the graded junction and the implant/etch mask.

The method of the present invention reduces the number of masking steps utilized in the formation of the memory device, thereby increasing the efficiency of the device fabrication process and reducing the cost of the process. Further, by improving the self-aligned source etch process, dopant control is improved. Still further, use of the resist spacers reduces fluctuation in the threshold voltage characteristics of adjacent memory cells, thus substantially eliminating the problem known as overerase induced column leakage.

BRIEF DESCRIPTION OF THE DRAWINGS

These and other advantages and features of the present invention will become apparent from the following description of the preferred embodiment, taken in conjunction with the accompanying drawings, where like numerals represent like elements, in which:

Figure 1B:
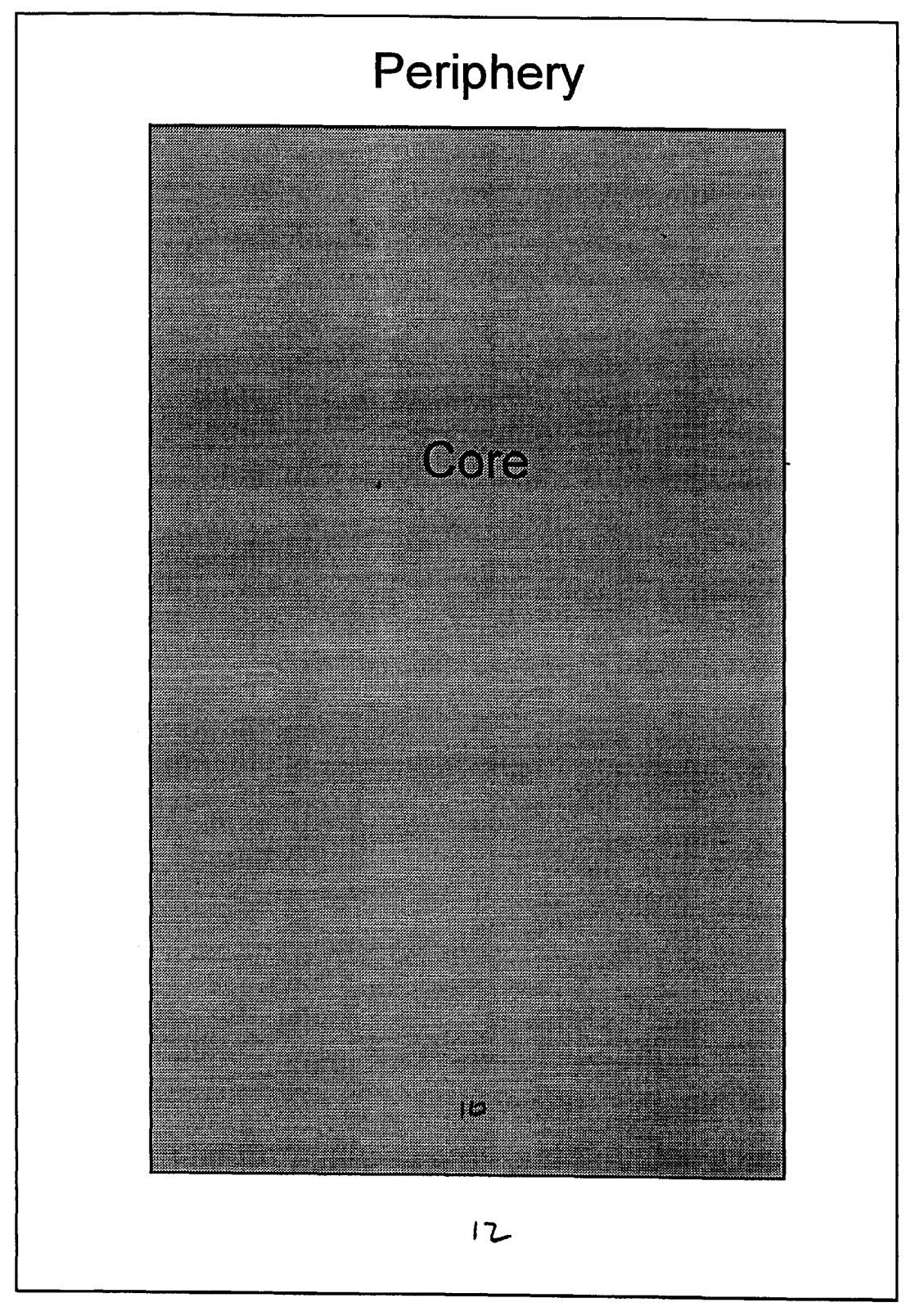

FIG. 1B depicts a block representation of an EPROM or EEPROM integrated circuit.

FIGS. 3–6 illustrate cross-sections of a core region and periphery region of a memory device formed in accordance with conventional processing techniques.

FIG. 7A illustrates a cross-section of a core region and a periphery region of a memory device, where the cross-section of the wafer formation process in the core region is along line A—A in FIG. 2.

FIG. 7B illustrates a cross-section of a core region and a periphery region of a memory device, where the cross-section of a wafer substrate in the core region is along line B—B in FIG. 2.

FIG. 8 is a cross-section of the core and periphery areas of a wafer substrate illustrating the double diffusion implant region prior to formation of the periphery area devices.

FIG. 9 is a cross-section of the core and periphery areas of a wafer substrate illustrating formation of the core n+ implant prior to formation of the periphery area devices.

FIGS. 10–14 are cross-sections illustrating fabrication of a memory device similar to that shown in FIGS. 1 and 2, but formed in accordance with the process of the present invention.

FIGS. 15A–18A show cross-sections of a memory device similar to that shown in FIG. 2 in a portion of the core area in a device formed in accordance with the first embodiment of the present invention along a cross-sectional view equivalent to that represented in line A—A in FIG. 2.

FIGS. 15B–18B show cross-sections of a portion of the core area in a memory device formed in accordance with the first embodiment of the present invention along a cross-sectional view equivalent to that represented along line B—B in FIG. 2.

FIGS. 15C–17C show cross-sections of a second embodiment of the present invention for forming a memory device along line B–B$^1$ in FIG. 2 in the core region.

DETAILED DESCRIPTION OF THE EMBODIMENTS

An improved manufacturing process for forming flash EEPROM devices is hereinafter disclosed. In the following description, numerous details, for example, specific materials, process steps, etc., are set forth in order to provide a thorough understanding of the present invention. It will be obvious, however, to one skilled in the art that the specific details need not be employed to practice the present invention.

Figure 1A:
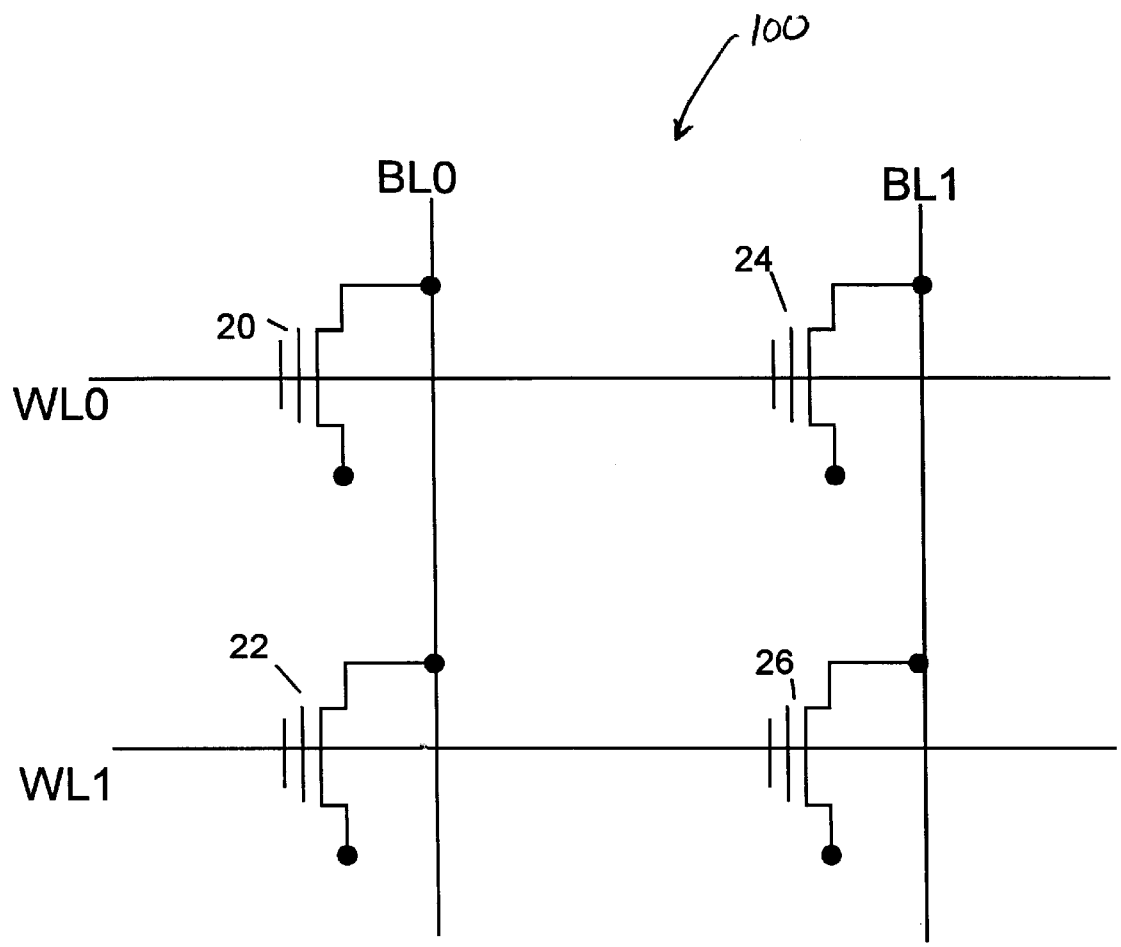
FIG. 1A depicts a partial schematic view of a conventional EEPROM memory array.
Figure 2:
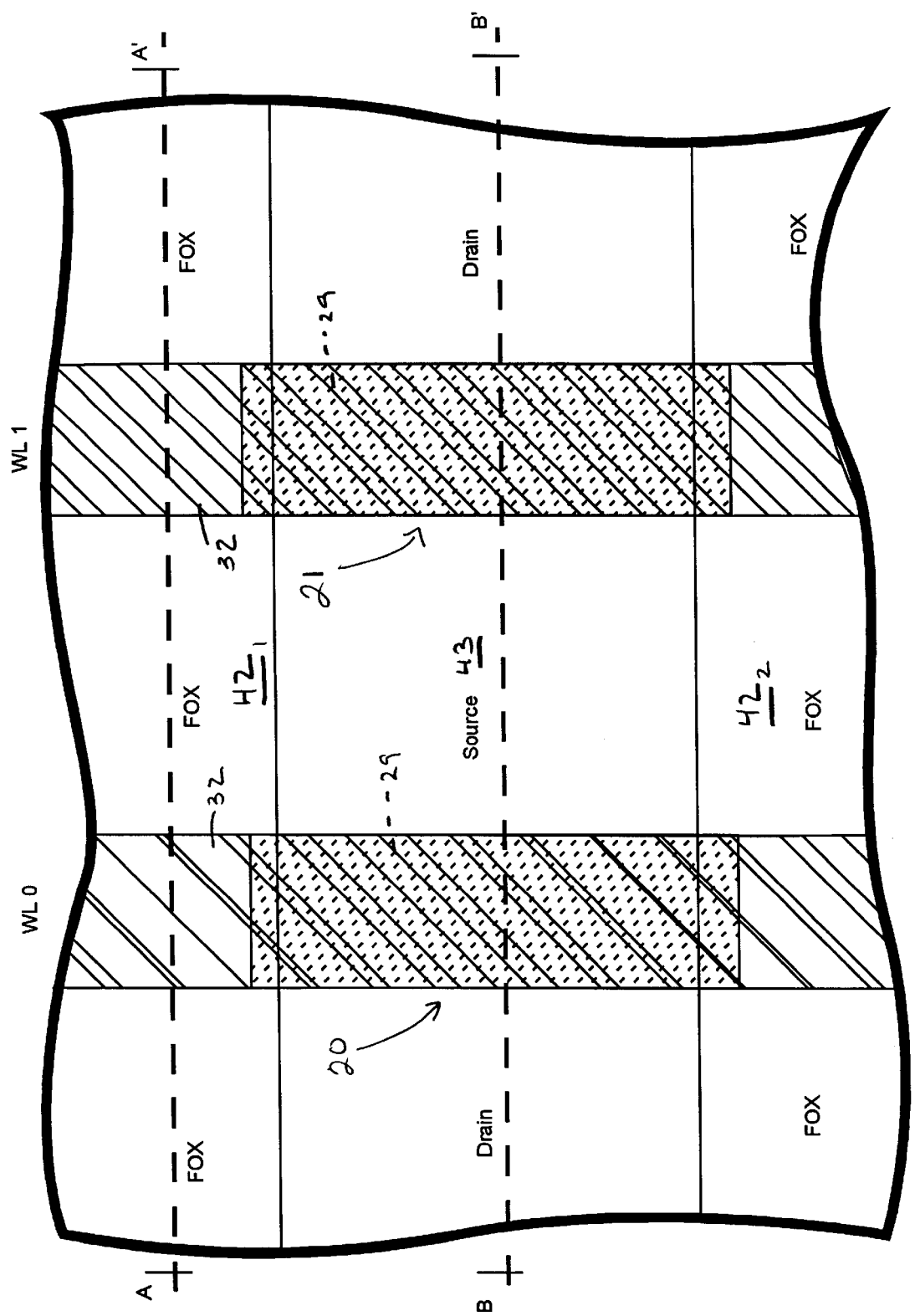
FIG. 2 illustrates a partial top view of a flash memory array formed on a semiconductor substrate.
Figure 7C:
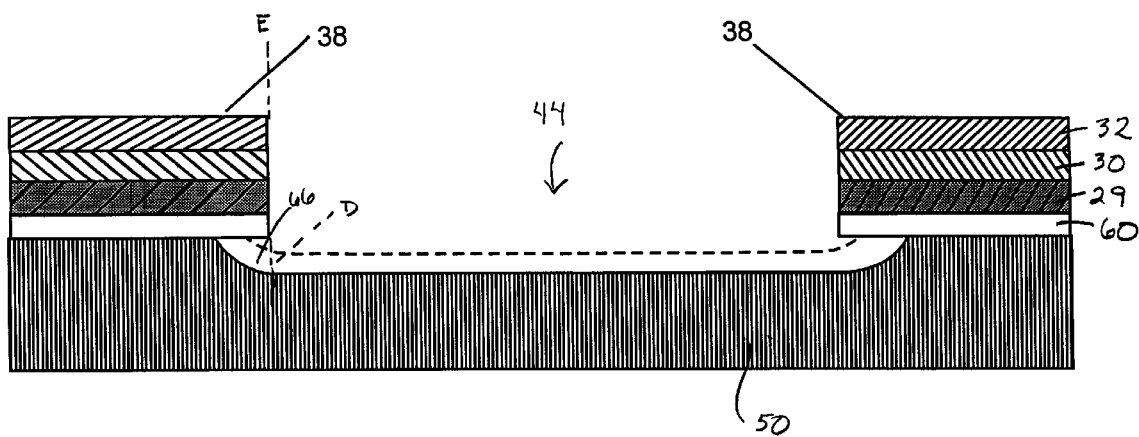
FIG. 7C is an enlarged cross-section of the device structure shown in FIG. 7B, illustrating the undercutting associated with the self-aligned source etch process of the prior art.

FIGS. 10–18 are cross-sections of various portions of a memory array, such as, for example, that shown in FIG. 2, but which is formed in accordance with the process of the present invention. A key aspect of the present invention is that the core cells are all formed prior to the formation of the periphery cell transistors. This allows a savings of at least two masking steps by combining the SAS and DDI masks into one step, and improvement of the dose and injunction depth and uniformity controls of the core transistors. Moreover, the problem of column leakage is addressed through use of a resist spacer in the self-aligned source etch, the spacer resulting in improved scaling of core region transistors.

FIGS. 10–18 show a cross-section of the core region and periphery region of a semiconductor array to be fabricated in accordance with the present invention. Referring to FIG. 10, semiconductor substrate 50, which may comprise a p type substrate, will have a tunnel or gate oxide 60 formed, for example, by thermal oxidation, and field oxide regions $60_1$–$60_2$ (FIG. 19) and $60_3$–$60_4$ (FIG. 10) formed by a LOCOS process to isolate adjacent device cells. Polysilicon layers 52,56 and inter-polysilicon dielectric (or oxynitride) layer 54 are deposited on the surface of the core area, with polysilicon (or polysilicide) layer 56 being deposited in the periphery area, in accordance with conventional processing techniques.

In accordance with the present invention, rather than forming the periphery area transistor gate structures first, the core cell gate structures are first formed. A core cell photoresist mask layer 58 is formed over the surface of core cell area and periphery cell area, as shown in FIG. 11. As shown in FIG. 12, resist layer 58 is patterned by exposing the photoresist 58 to a mask and, depending on the type of photoresist used, stripping the exposed or unexposed portions of resist layer 58 leaving portions $58_1$,$58_2$ covering portions of the core region. An etch process is then utilized to form core cell gate structures 64 in the core region, as shown in FIG. 13.

Next, as shown in FIG. 14, an implantation of an n type impurity is made into substrate 50 to form n+ drain regions 68,69 and source region 66 in core area 10. This allows formation of the n+ drain regions prior to the self-aligned source etch step, and in a particular advantage of the process of the invention, allows the elimination of a separate implant masking step. In the prior art core n+ implant, described with respect to FIG. 9, a separate n+ implant mask is required to form source area 46 (equivalent to source region 66). By implanting the source and drain at this point in the process, the separate mask is eliminated. This implant is not possible in the prior art because the separate mask is required to protect the periphery CMOS devices. In the process of the present invention, since such CMOS devices are not yet formed and are protected by polysilicon layer 56, the implant will not adversely affect the periphery and no mask is required in the periphery area. Elimination of this mask saves processing time and expense.

Figure 17A:
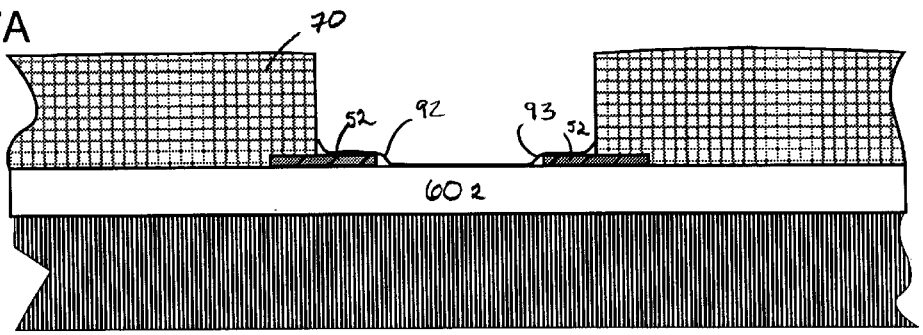
Figure 18A:
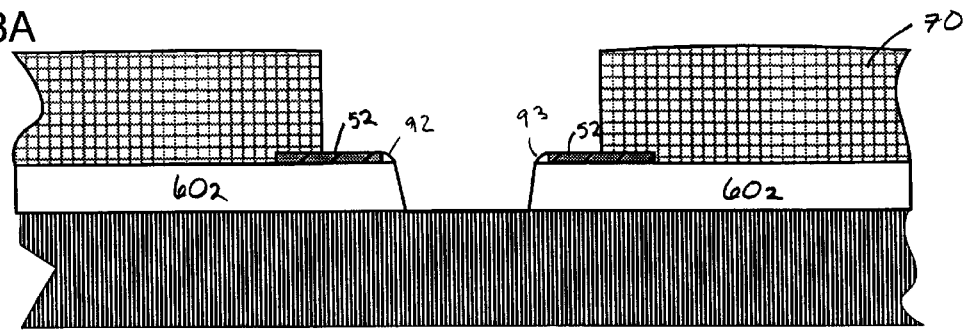
Figure 17B:
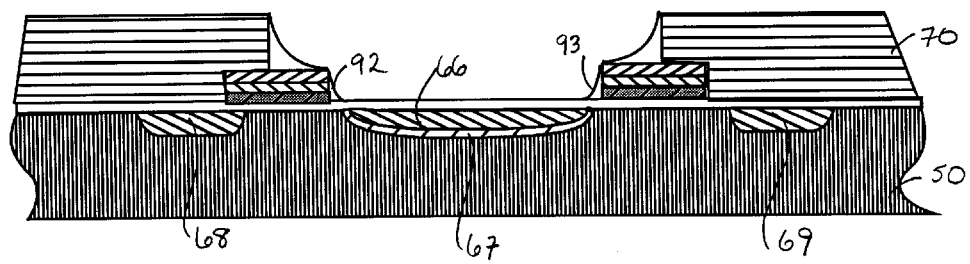
Figure 18B:
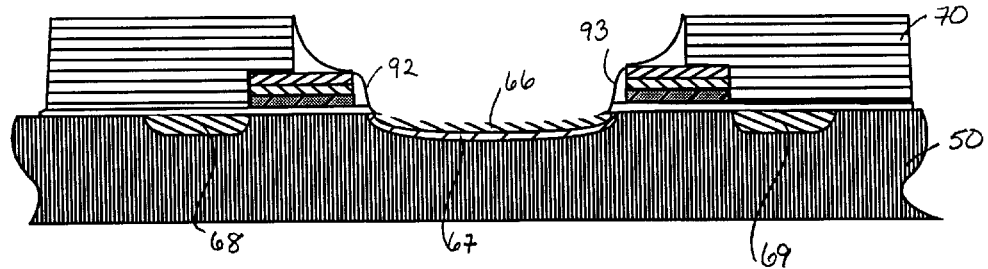
Figure 19:
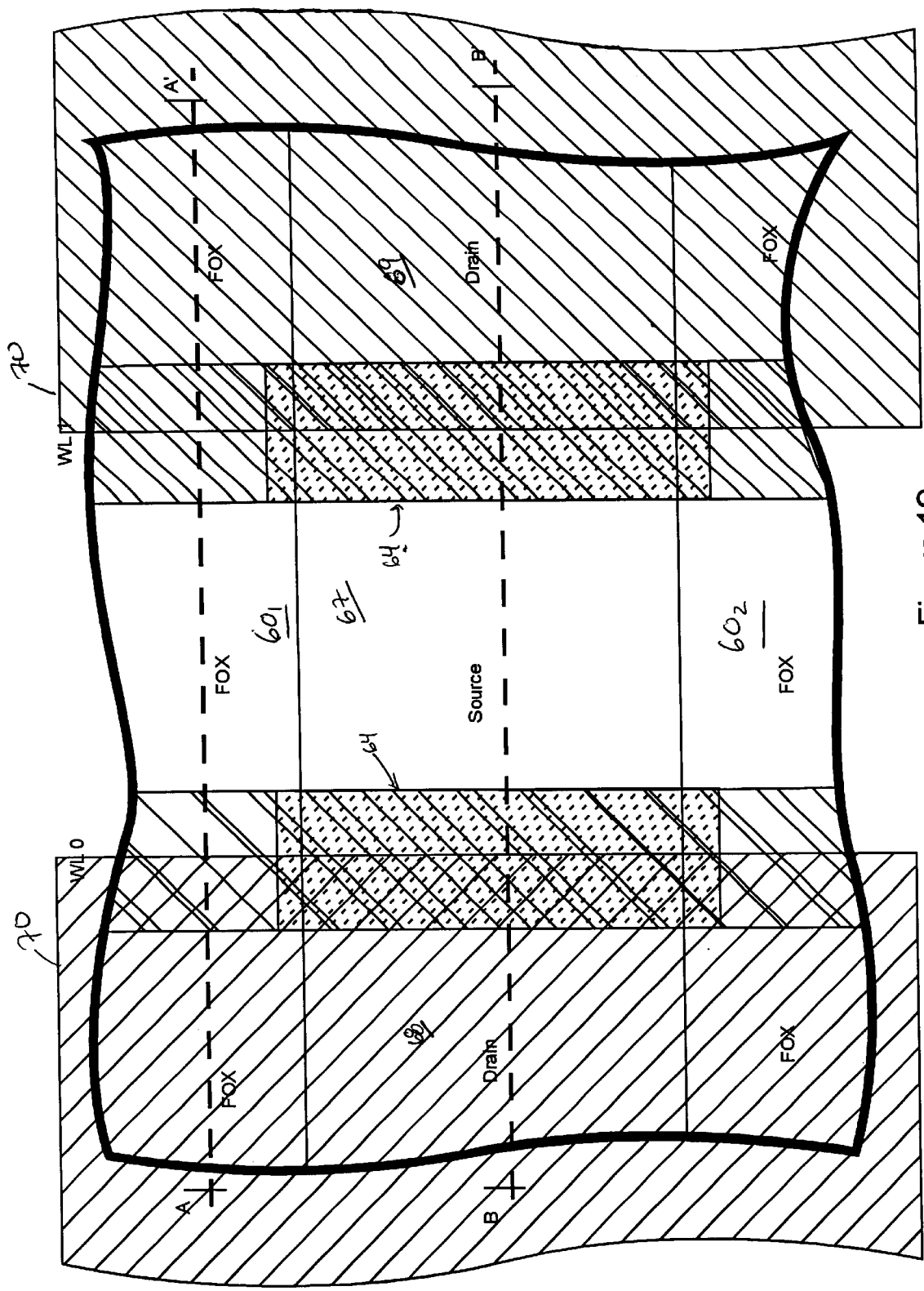
FIG. 19 is a plan perspective of the substrate similar to FIG. 2 showing placement of the combination mask of the present invention, illustrated in FIGS. 14A–18B.

Shown in FIGS. 15A–18A are cross-sections of the wafer illustrating a first embodiment of the process of the present invention in the field oxide region $60_1$ along line A–A$^1$ in FIG. 19. Shown in FIGS. 15B–18B are cross-sections of the wafer substrate equivalent to views along lines B–B$^1$ in FIG. 19. FIGS. 15A–18A, 15B–18B illustrate a unique feature of the present invention of a combined SAS/DDI mask on key portions of the substrate.

Figure 15A:
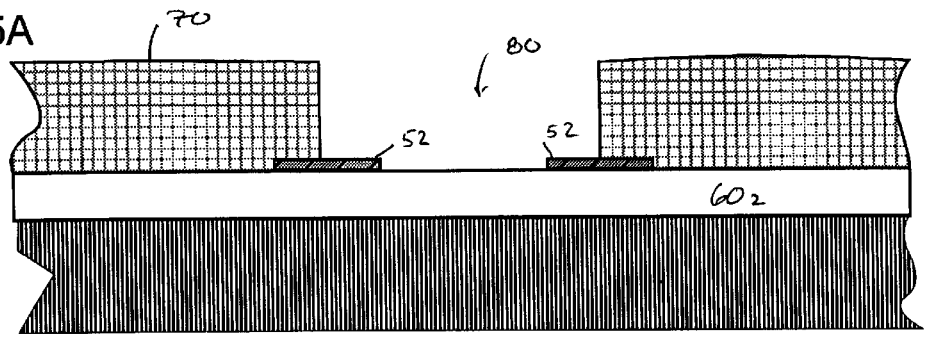

As shown in FIG. 15A, the blanket n+ implant which forms regions 66,68,69 does not penetrate the substrate under field oxide regions $60_1$–$60_4$.

Figure 15B:
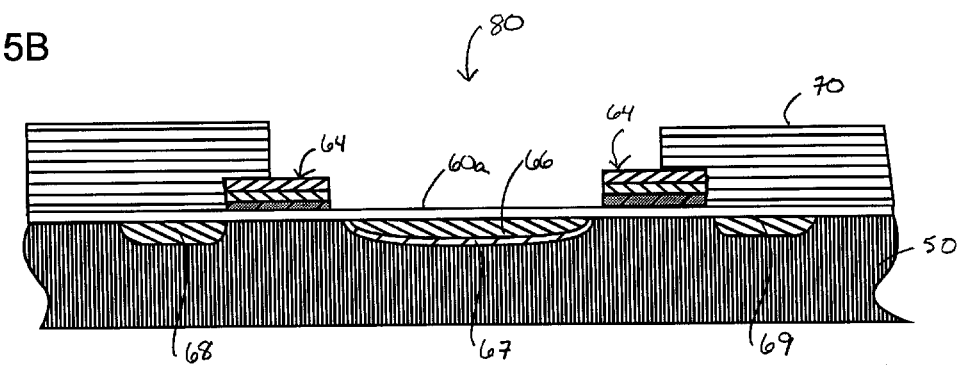

As shown in FIGS. 15A–15B, the combined DDI/SAS photoresist mask 70 is applied to the surface of the structure. Layer 70 accomplishes with a single mask both the self-aligned source etch of the field oxide layer and the double-diffusion implant. Mask layer 70 is patterned using conventional photoresist techniques to expose region 80 in field oxide region $60_1$. A plan view of the combined DDI/SAS mask layer 70 is shown in FIG. 19.

After application and patterning of combined DDI/SAS mask layer 70, a low energy double-diffusion implant of an n type impurity is performed through the thin oxide 60a (FIG. 15B). This implant forms the so-called double diffusion implant n-type region 67 extending to a junction depth deeper than n+ region 66 in source region 80. Typically, phosphorous is used as the implant species since phosphorous has a high diffusion rate and penetrates deeper into the substrate. This yields a graded junction (formed by the regions 66 and 67), in the source region of the core. As shown in FIG. 15A, the DDI implant does not reach the silicon substrate underlying field oxide region 601. Once the diffusion of the DDI implant is complete, an additional source side core n+ implant may be made in region 80, if desired, to enhance region 66.

Figure 16A:
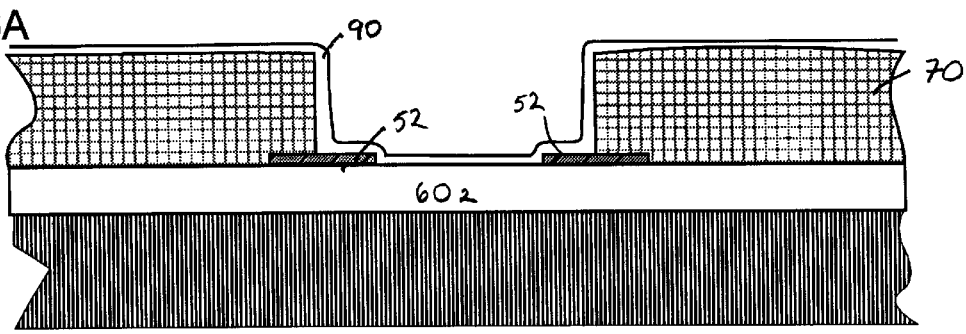
Figure 16B:
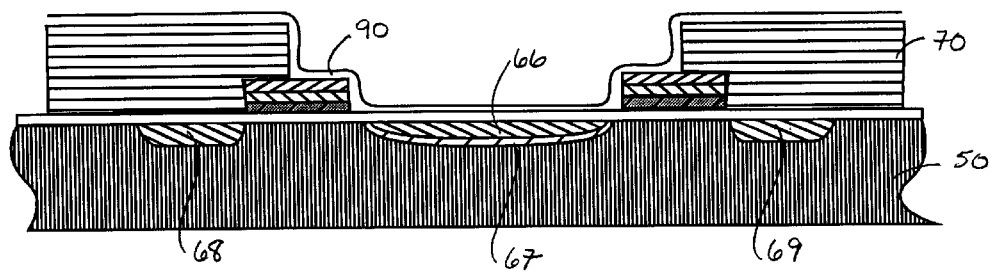

In another unique aspect of the present invention, as shown in FIGS. 16A,16B, a thin, conformal resist layer 90 is applied over combined DDI/SAS mask layer 70 and the field oxide 60$_1$–60$_2$ in region 80. Resist coating 90 may be of a thickness between 500 and 5,000 Å.

Subsequently, as shown in FIGS. 17A and 17B, an anisotropic reactive ion etch in an oxygen atmosphere is then utilized to remove portions of resist coating 90 and form resist spacers 92,93 adjacent to gate structures 62,64 in region 80.

Once the reactive ion etch is completed, a self-aligned source etch is utilized to expose the surface of substrate 50 in region 80 as shown in FIGS. 18A and 18B. The effect of resist spacers 92 and 93 as shown in FIG. 18B is to laterally confine the SAS etch so that any substrate gouging will not undercut the gate structure, as normally seen with a conventional self-aligned source etch. Moreover, the channel regions of the transistors to be formed by stack 64 are protected from implant damage or over-doping during processing. Hence, the problem of column leakage is essentially eliminated.

Hence, the combined DDI/SAS mask layer 70 thus serves the dual purpose of an SAS etch resist and DDI implant mask, saving one mask step over the prior art. Resist layer 70 is thereafter stripped, and processing of the periphery cells proceeds in accordance with well-known techniques.

An alternative embodiment of the method for forming the source region is shown in FIGS. 15C–17C.

Figure 15C:
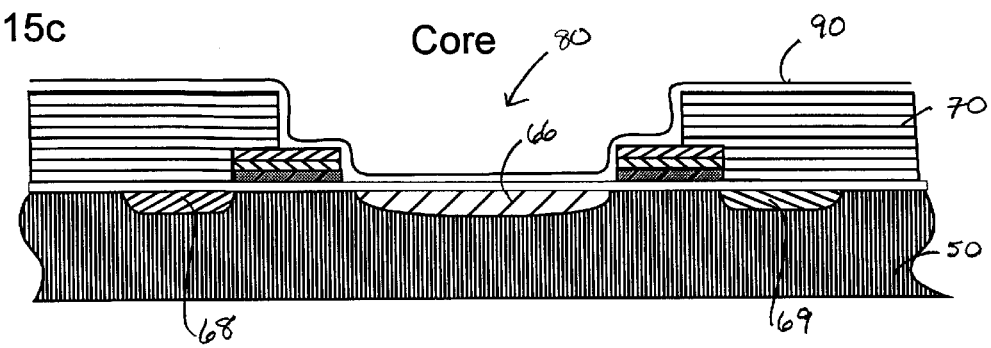
Figure 16C:
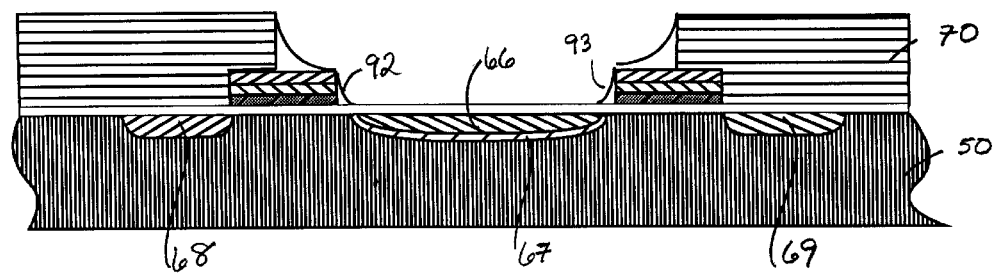
Figure 17C:
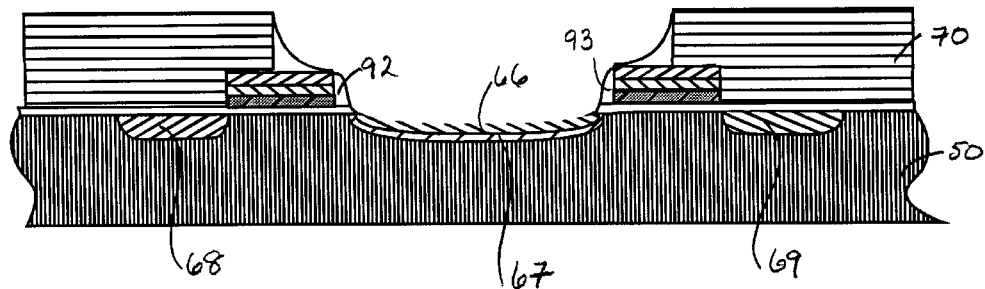

As shown in FIG. 15C, the conformal oxide layer 90 may be deposited after the combined DDI/SAS mask layer 70, but prior to implantation of region 66 into substrate 50. A room temperature oxide deposition process, such as a spin on glass-type process, should be used. With the conformal oxide 90 in place, the substrate surface has an additional means of protection from any implant damage. In this embodiment, the channel region of devices 20 and 22 will also be additionally protected. This is especially important as scaling reduces the device dimensions beyond the 0.25 $\mu$level. A reactive ion etch is then used, for example, to form spacers 92,93, as shown in FIG. 16C. Subsequently, as shown in FIG. 16C, the DDI implant to form region 66 is made, and in FIG. 17C, the processing and etching continues in a manner equivalent to that shown in FIG. 18B.

Yet a third embodiment for forming the source region of the present invention is shown in FIGS. 20–24. In this embodiment of the invention, processing of the device continues up through the method as described above through completion of steps shown in FIG. 13. As one will recall, in FIG. 14, the blanket n+ implant is used to form the drain regions 68,69 and region 66 for the source of the device.

Figure 20:
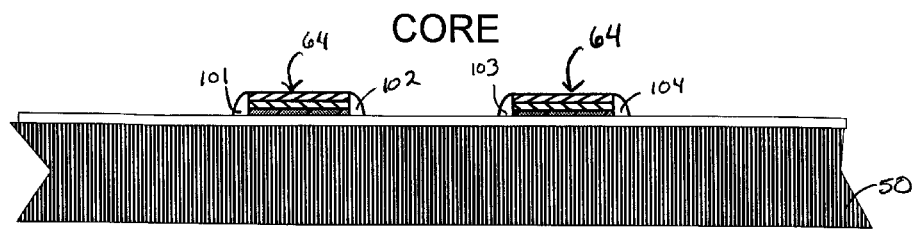
FIGS. 20–24 show cross-sections of the core regions illustrating a third embodiment of the present invention of forming a memory device in accordance with the present invention along line B—B in FIG. 2.

In the third embodiment of the present invention, as shown in FIG. 20, prior to the n+ implant, spacers are formed adjacent to gate structures 64 in a manner readily known to one of average skill in the art. For example, a thin resist coating such as a TEOS oxide is applied to the surface of the substrate and stacks 64. It should be recognized that other materials may be utilized to form the spacers in accordance with well-known techniques. A reactive ion etch is then utilized to form the spacers 101–104 as shown in FIG. 20.

Figure 21:
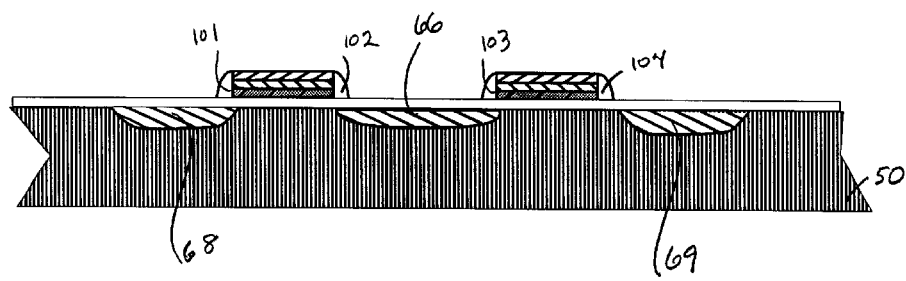

Subsequently, as shown in FIG. 21, the blanket n+ implant to form the region 66 in the source and drain regions 68,69 of the device is provided.

Figure 22:
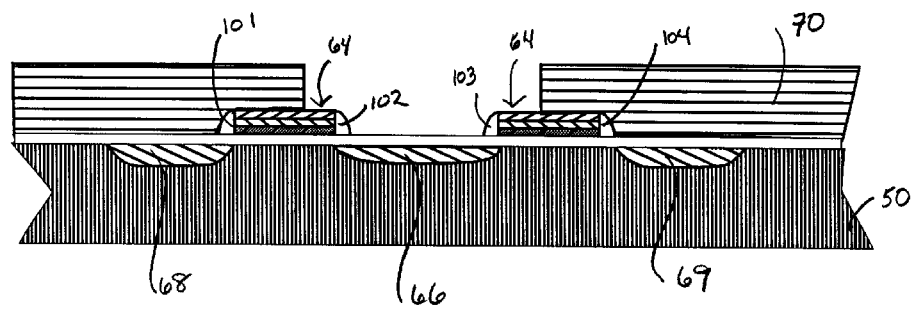
Figure 23:
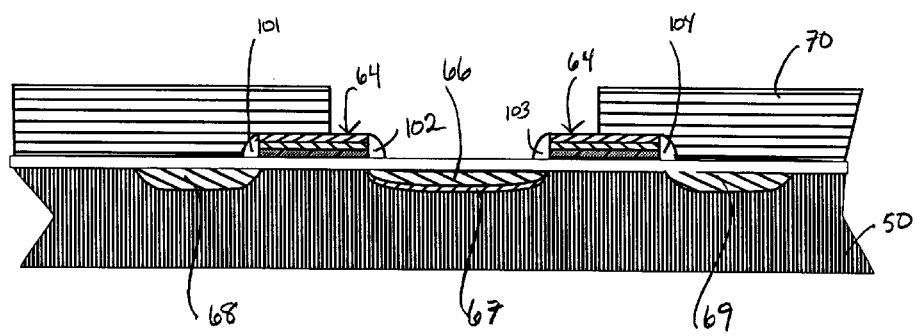
Figure 24:
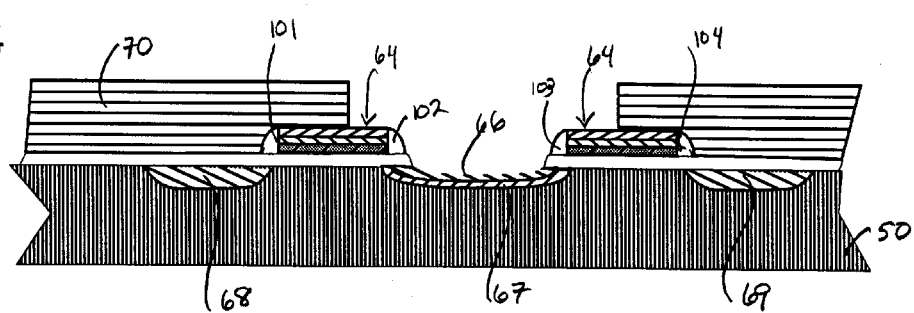

As shown in FIG. 22, the combo mask 70 is then formed and patterned in accordance with the steps described above with respect to FIG. 15B. Subsequently, as shown in FIG. 23, the double diffusion implant can be provided to form region 67, and the SAS oxide etched as shown in FIG. 24.

The third embodiment of the present invention eliminates the need for a conformal oxide layer to be provided over the surface of combined SAS/DDI mask layer 70 (as was done in the second embodiment) and the additional etching step required to etch the combo mask once the mask is in place. Rather, the resist spacers are formed prior to formation of the combo mask 70.

Figure 25:
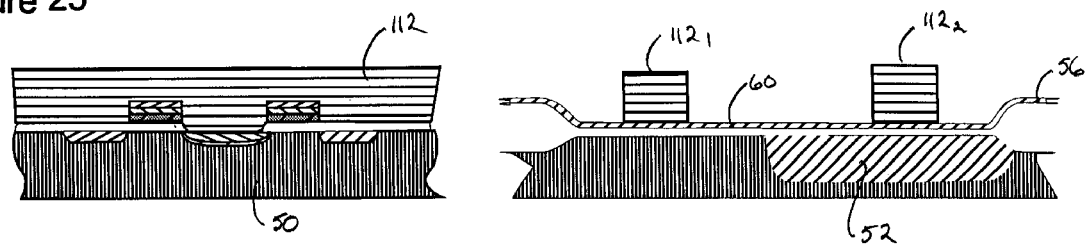
FIGS. 25–27, 28A and 28B show cross-sections of the core and periphery regions illustrating processing of the periphery area of a memory device in accordance with the present invention.
Figure 26:
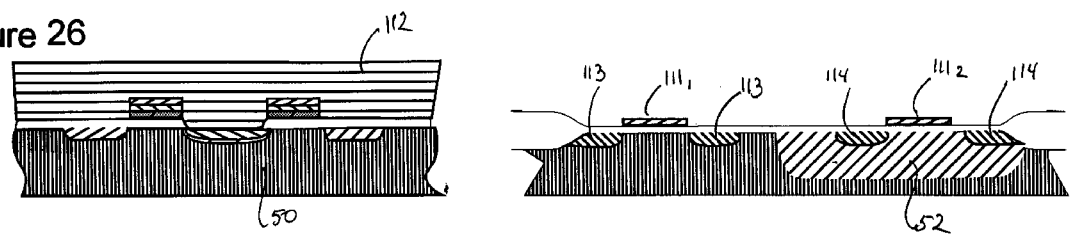
Figure 27:
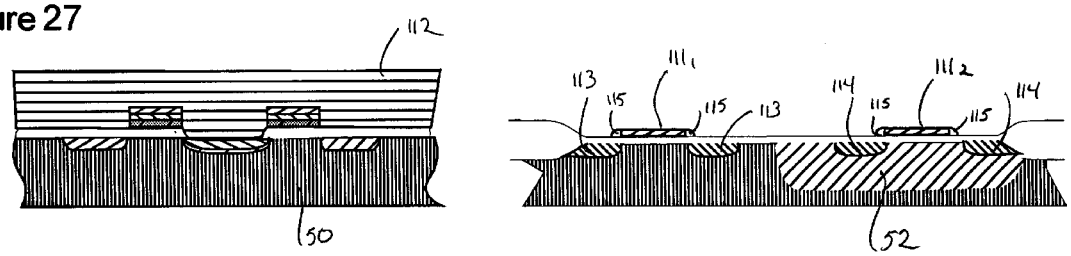
Figure 28A:
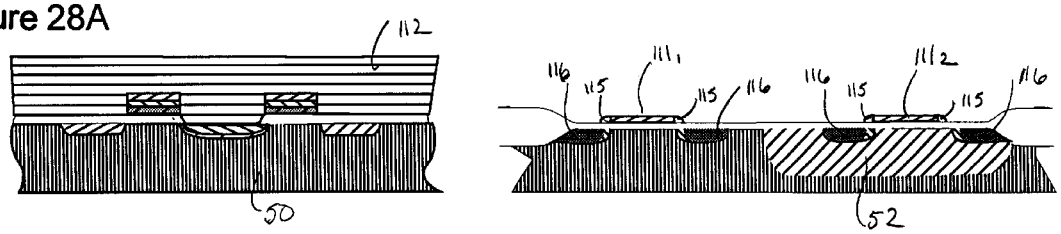
Figure 28B:
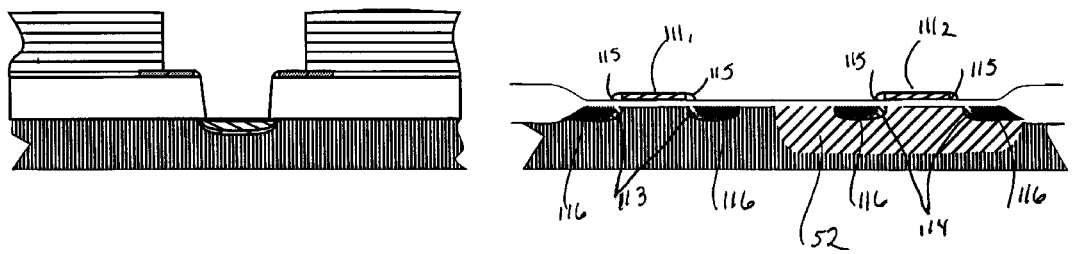

Processing of periphery region 107 is illustrated in FIGS. 25–28. As shown in FIGS. 25–28, the periphery transistors will comprise CMOS devices so that if substrate 50 is a p-type substrate, well 52 will comprise an n-well 52 formed in p-type substrate 50. As shown in FIG. 25, a periphery gate mask 112 is applied and patterned to leave mask regions 112$_1$,112$_2$. A periphery gate etch is performed to form gate structures 111$_1$,111$_2$ in periphery region 12, and resist 112 is stripped. It should be readily recognized that an n type substrate with a p type well could also be utilized as the devices formed in the periphery are CMOS devices.

Formation of the LDD and source and drain regions in the periphery region proceeds through conventional processing steps summarized as follows (for simplicity, each individual masking is not shown):

1. A first pre-implant oxidation (not shown) to clean the surface of the structure;
2. Application of a mask resist (not shown) for n type LDD implant and patterning of the resist;
3. Implanting an n type LDD impurity forming n+ or – regions 113 (FIG. 20) and stripping of the resist mask;
4. Application of a mask resist (not shown) for p type LDD implant and patterning of the resist;
5. Implanting a p type impurity to form p or p-regions 114 (FIG. 20), LDD regions and stripping of the resist mask;
6. Formation of the spacer regions 115 adjacent to active regions by deposition of a spacer material (such as SiO$_2$) and etching of the oxide (FIG. 21);
7. A second pre-implant oxidation (not shown) to clean the surface of the structure;
8. Application of an n+ source and drain implant photoresist mask and patterning the resist to etch back the oxide in the core (FIG. 22) to open the core source, VSS area 63 for connection purposes;
9. Implanting an n type impurity to form n+ source/drain regions 116 (FIG. 22) and self-aligned source region 63 (FIG. 22), and stripping the resist;
10. Application of a p+ type source and drain implant photoresist mask (not shown) and patterning the resist;
11. Implanting a p type impurity to form p+ source/drain regions 117 (FIG. 22) and stripping the resist mask; and
12. A source drain oxidation and/or annealing step (not shown).

It should be noted that in step 8—patterning of the n+ region source/drain mask for the periphery transistors—the core mask region 80 (FIG. 18A) overlying the self-aligned source region is re-opened so that the n+ implant for the periphery region transistors can also be used to form the self-aligned source region. No additional masking steps are required to implant this region.

Following formation of the periphery region transistors, contacts are formed to complete the circuit using a conductive metal or refractory metal silicide conducting material.

Thus, a total of two masking and patterning steps are saved in the process of the present invention over the prior art process. By combining the self-aligned source mask and double-diffusion implant mask into a single mask, a savings of one mask is achieved. The blanket core n+ implant to form the source and drain region of the memory transistor also saves an additional mask over the prior art. This is made possible by moving the periphery gate mask and etch formation to a later sequence in the process. By placing the DDI implant before the SAS etching process, polymer damage during the SAS etch which normally must be cleaned prior to DDI implant is not necessary saving an additional cleaning step over the prior art.

Furthermore, DDI and core n+ implants which were formed prior to the self-aligned source etch can have much better dose and junction depth control. This is because the polymer contamination which usually results from the SAS etch and which is cleaned by an oxidation step prior to the DDI implant is not present. Moreover, the source side only core n+ implant allows the separate optimization of source junctions for the erase function of the memory device. A resist spacer utilized to offset the self-aligned source etch reduces damage to the tunneling gate oxide. In addition, such spacers allow for easier scaling of the device formed in accordance with the methods of the present invention. Moreover, the number of process steps is reduced.

The many features and advantages of the present invention will be readily apparent to one of average skill in the art. Obvious modifications of the process will also be readily apparent to one of average skill. All such features, advantages and modifications considered as being within the scope of the invention are specified herein and defined in the following claims.

What is claimed is:

1. A method for manufacturing a memory device, the device having a core memory cell region and a periphery region, wherein said memory device includes a substrate having, in said core memory cell region, an oxide layer, a first polysilicon layer, an inter-polysilicon dielectric layer, and a second polysilicon layer, and further having, in said periphery region, said oxide layer and said second polysilicon layer, comprising:

(a) forming a core cell mask layer, the mask layer covering the periphery region and selectively covering portions of the core memory cell region;

(b) forming core memory cell devices in the core memory cell region;

(c) removing the core cell mask layer;

(d) the step following steps (b) and (c) of forming a periphery region mask layer, the periphery region mask layer covering the core cell region and selective portions of the periphery region; and (e) forming active devices in the periphery region;
   wherein said step (b) comprises (1) etching selected portions of said second polysilicon layer, inter-polysilicon dielectric layer, and first polysilicon layer in said core memory cell region to form at least one gate stack;

(2) implanting an impurity into the substrate adjacent to said at least one gate stack to form at least one source region and at least one drain region;

(3) forming a mask layer over said core region;

(4) implanting a second impurity into the source region;

(5) forming an oxide layer over the source region;

(6) depositing a resist coating over the surface of the gate stack and the combination mask layer;

(7) etching the resist layer to form spacers adjacent to the gate stacks; and (8) etching the oxide layer overlying the source region to enable connection to the implanted impurities.

2. The method of claim 1 wherein the second implant forms a graded source region in conjunction with the first implant.

3. The method of claim 1 wherein said step (2) comprises implanting an n type impurity into the substrate.

4. A method for manufacturing a memory device, the device having a core memory cell region and a periphery region, wherein said memory device includes a substrate having, in said core memory cell region, an oxide layer, a first polysilicon layer, an inter-polysilicon dielectric layer, and a second polysilicon layer, and further having, in said periphery region, said oxide layer and said second polysilicon layer, comprising:

(a) forming a core cell mask layer, the mask layer covering the periphery region and selectively covering portions of the core memory cell region;

(b) forming core memory cell devices in the core memory cell region;

(c) removing the core cell mask layer;

(d) the step following steps (b) and (c) of forming a periphery region mask layer, the periphery region mask layer covering the core cell region and selective portions of the periphery region; and (e) forming active devices in the periphery region;
   wherein said step (b) comprises (1) etching selected portions of said second polysilicon layer, inter-polysilicon dielectric layer, and first polysilicon layer in said core memory cell region to form at least one gate stack;

(2) implanting an impurity into the substrate adjacent to said at least one gate stack to form at least one source region and at least one drain region;

(3) forming a mask layer over said core region;

(4) implanting a second impurity into the source region; and (5) forming an oxide layer over the source region;
   wherein the method further includes the step, preceding step (5) of (4a) depositing a resist coating over the surface of the gate stack and the combination mask layer;
   and the method further includes the steps, following step (5), of (6) etching the resist layer to form spacers adjacent to the gate stacks; and (7) etching the oxide layer overlying the source region to enable connection to the implanted impurities.

5. The method of claim 1 wherein said nonvolatile memory device includes a substrate having, in said core memory cell region, an oxide layer, a first polysilicon layer, an inter-polysilicon dielectric layer, and a second polysilicon layer, and further having, in said periphery region, said oxide layer including and said second polysilicon layer, wherein said step (b) comprises:

(1) etching selected portions of said second polysilicon layer, inter-polysilicon dielectric layer, and first polysilicon layer in said core memory cell region to form at least one gate stack;

(2) depositing a resist layer over the surface of the substrate and the gate stack;

(3) forming spacers adjacent to the gate stacks by etching the resist layer;

(4) implanting a first impurity into the substrate adjacent to said at least one gate stack to form at least one source region and at least one drain region;

(5) forming a combination mask layer over said source region;

(6) removing selected portions of the combination mask layer covering said source region; and (7) implanting a second impurity into the source region.

6. The method of claim 5 wherein said step (7) includes implanting the second impurity to form a graded source junction.

7. The method of claim 6 further including the step of:

(8) etching the oxide layer overlying the source region to expose the underlying substrate.

8. The method of claim 1 wherein said step (d) comprises:

(1) depositing a periphery gate photoresist mask;

(2) exposing said photoresist layer to a mask; and, (3) removing select portions of said photoresist mask layer.

9. The method of claim 1 wherein said step (e) comprises the sub-steps of:

(1) forming a first resist mask over the surface of the periphery region;

(2) implanting an impurity of a first conductivity type into the substrate;

(3) removing said first resist mask;

(4) forming a second resist mask;

(5) implanting an impurity of a second conductivity type into the substrate;

(6) removing said resist mask;

(7) depositing a spacer material over the surface of the substrate;

(8) removing selected portions of said spacer material to form spacers overlying portions of said regions formed by said first and second implants;

(9) forming a third resist mask;

(10) implanting impurity of the first conductivity type in a stronger concentration than in said previous implantation step;

(11) removing said third resist mask layer;

(12) applying a fourth resist masking layer;

(13) implanting an impurity of the second conductivity type in a concentration which is greater than the impurity concentration of the previous implant of the second conductivity type;

(14) removing said fourth resist layer; and,

(15) annealing the device.

10. A method for manufacturing a memory device on a substrate, the device having a core region for memory cells, and a periphery region for active devices, the device including at least one field oxide region overlying a common source junction in said core region, comprising:

(a) forming gate structures in the core region;

(b) implanting a first impurity in the core region to form a source and a drain region;

(c) masking the core region with a combination implant/etch mask layer covering the periphery region and selected portions of the core region, the selected portions including said drain region;

(d) implanting a second impurity in the source region; and (e) forming said active devices in the periphery region; wherein the method further includes steps, between steps (d) and (e) of (1) depositing a resist coating over the surface of the gate stack and the combination implant/etch mask layer;

(2) etching the resist layer to form spacers adjacent to the gate stacks; and (3) etching the oxide layer overlying the source region to enable connection to the implanted impurities.

11. The method of claim 10, further including the steps, following step (e), of:

(f) applying a resist coating in the core region;

(g) etching the resist coating to form spacers;

(h) etching the oxide overlying the source region; and (i) removing the resist layer.

12. The method of claim 10 wherein said step (c) comprises a blanket implant of an n type impurity to form n+ regions in the substrate.

13. The method of claim 10 wherein said step (a) comprises the substeps of:

(1) forming an oxide layer in the core and periphery regions;

(2) forming a first polysilicon layer in the core region;

(3) forming an inter-polysilicon dielectric layer in the core region;

(4) forming a second polysilicon layer in the core region and in the periphery region, the second polysilicon region overlying the inter-polysilicon dielectric region in the core region and the oxide layer in the periphery region; and (5) etching selected portions of said second polysilicon layer, inter-polysilicon dielectric layer, and first polysilicon layer in said core memory cell region.

14. The method of claim 10 wherein step (e) comprises:

(3) forming a mask layer over said source region; and (4) removing selected portions of the mask layer covering said source region.

15. The method of claim 10 wherein said step (d) forms a graded source region in conjunction with the first implant in step (b).

16. A method for manufacturing a memory device on a substrate, the device having a core region for memory cells, and a periphery region for active devices, the device including at least one field oxide region overlying a common source junction in said core region, comprising:

(a) forming gate structures in the core region;

(b) implanting a first impurity in the core region to form a source and a drain region;

(c) masking the core region with a combination implant/etch mask layer covering the periphery region and selected portions of the core region, the selected portions including said drain region;

(d) implanting a second impurity in the source region; and (e) forming said active devices in the periphery region; wherein the method includes the step, preceding step (b) of
  (1) depositing a resist coating over the surface of the gate stack;
  (2) etching the resist layer to form spacers adjacent to the gate stacks; and further includes the step, following step (d), of
  (3) etching the oxide layer overlying the source region to enable connection to the implanted impurities.

17. A method for manufacturing a memory device on a substrate, the device having a core region for memory cells, and a periphery region for active devices, the device including at least one field oxide region overlying a common source junction in said core region, comprising:
  (a) forming gate structures in the core region;
  (b) implanting a first impurity in the core region to form a source and a drain region;
  (c) masking the core region with a combination implant/etch mask layer covering the periphery region and selected portions of the core region, the selected portions including said drain region;
  (d) implanting a second impurity in the source region; and
  (e) forming said active devices in the periphery region; wherein the method includes the step, preceding step (d) of
  (1) depositing a resist coating over the surface of the gate stack and the combination implant/etch mask layer;
and the method further includes the steps, following step (d), of
  (2) etching the resist layer to form spacers adjacent to the gate structures; and
  (3) etching the oxide layer overlying the source region to expose the substrate.

18. A method for manufacturing a memory device on a substrate, the device having a core region for memory cells, and a periphery region for active devices, the device including at least one field oxide region overlying a common source junction in said core region, comprising:
  (a) forming gate structures in the core region;
  (b) implanting a first impurity in the core region to form a source and a drain region;
  (c) masking the core region with a second mask layer covering the periphery region and selected portions of the core region, the selected portions including said drain region;
  (d) implanting a second impurity in the source region; and
  (e) forming said active devices in the periphery region;
  (f) applying a resist coating in the core region;
  (g) etching the resist coating to form spacers;
  (h) etching the oxide overlying the source region; and
  (i) removing the resist layer and resist coating.

19. The method of claim 18 wherein said step (d) comprises implanting to form a graded source junction.

20. A method for manufacturing a memory device on a substrate, the device having a core region for memory cells, and a periphery region for active devices, the device including at least one field oxide region overlying a common source junction in said core region, comprising:
  (a) forming gate structures in the core region;
  (b) implanting a first impurity in the core region to form a source and a drain region;
  (c) masking the core region with a second mask layer covering the periphery region and selected portions of the core region, the selected portions including said drain region;
  (d) implanting a second impurity in the source region;
  (e) depositing a resist coating over the surface of the gate stack and the combination mask layer;
  (f) etching the resist layer to form spacers adjacent to the gate stacks;
  (g) etching the oxide layer overlying the source region to enable connection to the implanted impurities; and
  (h) forming said active devices in the periphery region.

21. A method for manufacturing a memory device on a substrate, the device having a core region for memory cells, and a periphery region for active devices, the device including at least one field oxide region overlying a common source junction in said core region, comprising:
  (a) forming gate structures in the core region;
  (b) implanting a first impurity in the core region to form a source and a drain region;
  (c) masking the core region with a second mask layer covering the periphery region and selected portions of the core region, the selected portions including said drain region;
  (d) implanting a second impurity in the source region;
  (e) forming said active devices in the periphery region; and
  (f) etching the oxide layer overlying the source region to enable connection to the implanted impurities.

22. A method of making a memory device on a semiconductor substrate, the device having an array of transistors formed in a core region of the memory device and a plurality of active devices formed in a periphery region of the memory device, the substrate having deposited thereon an oxide layer including field oxide regions formed therein, a first polysilicon layer, an inter-polysilicon dielectric layer and a second polysilicon layer, the second polysilicon overlying and masking at least the periphery region comprising:
  (a) forming a core cell photoresist mask layer on the second polysilicon layer in the core region;
  (b) removing select portions of the first and second polysilicon layers and the inter-polysilicon dielectric to form at least one gate structure in the core region;
  (c) removing the core cell photoresist layer;
  (d) implanting an n type impurity into the substrate to form at least a first and second impurity region in the substrate adjacent to said at least one gate structure;
  (e) forming an implant/etch photoresist mask layer on the surface of the substrate and in the periphery region, exposing said at least first impurity region;
  (f) implanting an n type impurity into the substrate to form an n region in said at least first impurity regions;
  (g) etching said field and pad oxide overlying a common source region; and
  (h) forming said active devices in the periphery region.

23. The method of claim 22 wherein the method function includes the steps between steps (f) and (g) of:
  (1) depositing a resist layer over the second photoresist layer; and
  (2) etching the third resist layer to form resist spacers adjacent to said at least one transistor gate structure.

24. The method of claim 22 wherein the method includes the step, preceding step (f) of:
  (1) depositing a resist coating over the surface of the said at least one gate structure and the implant/etch mask layer; and the method further includes the step, following step (f), of (2) etching the resist layer to form spacers adjacent to said at least one gate structure.

25. The method of claim 22 further including the steps, between steps (c) and (d), of:

(1) depositing a resist layer over the surface of the substrate and said at least one gate structure; and
(2) forming spacers adjacent to said at least one gate structure by etching the resist layer.

* * * * *

UNITED STATES PATENT AND TRADEMARK OFFICE
CERTIFICATE OF CORRECTION

PATENT NO. : 6,248,629 B1
DATED : June 19, 2001
INVENTOR(S) : Liu et al.

Page 1 of 1

It is certified that error appears in the above-identified patent and that said Letters Patent is hereby corrected as shown below:

Column 5,
Line 3, after "region" and before "An" delete "44_2." and substitute therefor -- $44_2$. --.

Column 9,
Line 8, after "region" and before "Once" delete "60_1." and substitute therefore -- $60_1$. --.

Column 10,
Line 57, after "source," and before "area" delete "VSS" and substitute therefor -- $V_{SS}$ --.

Column 13,
Line 25, after "claim" and before "further" delete "6" and substitute therefor -- 5 --.

Column 17,
Line 3, after "said" and before "gate" delete "at least one".

Signed and Sealed this

Twenty-eighth Day of May, 2002

Attest:

*Attesting Officer*

JAMES E. ROGAN
*Director of the United States Patent and Trademark Office*